(12) United States Patent
Hague

(10) Patent No.: US 8,912,566 B2
(45) Date of Patent: Dec. 16, 2014

(54) GATE AMPLIFICATION TRIAC

(71) Applicant: Yannick Hague, Mettray (FR)

(72) Inventor: Yannick Hague, Mettray (FR)

(73) Assignee: STMicroelectronics (Tours) SAS, Tours (FR)

( * ) Notice: Subject to any disclaimer, the term of this patent is extended or adjusted under 35 U.S.C. 154(b) by 253 days.

(21) Appl. No.: 13/658,670

(22) Filed: Oct. 23, 2012

(65) Prior Publication Data

US 2013/0105855 A1    May 2, 2013

(30) Foreign Application Priority Data

Oct. 26, 2011 (FR) ................................. 11 59707

(51) Int. Cl.
   *H01L 29/66* (2006.01)
   *H01L 29/747* (2006.01)
   *H01L 29/74* (2006.01)
   *H01L 29/06* (2006.01)

(52) U.S. Cl.
   CPC ............ *H01L 29/747* (2013.01); *H01L 29/7428* (2013.01); *H01L 29/0638* (2013.01); *H01L 29/0692* (2013.01)
   USPC .................................. 257/119; 257/E29.215

(58) Field of Classification Search
   USPC .......................................... 257/119, E29.215
   See application file for complete search history.

(56) References Cited

U.S. PATENT DOCUMENTS

| 6,034,381 A | * | 3/2000 | Pezzani | 257/107 |
| 2005/0133815 A1 | * | 6/2005 | Menard | 257/132 |

OTHER PUBLICATIONS

French Search Report and Written Opinion dated Aug. 22, 2012 from corresponding French Application No. 11/59707.

* cited by examiner

*Primary Examiner* — Zandra Smith
*Assistant Examiner* — Jamie C Niesz
(74) *Attorney, Agent, or Firm* — Allen, Dyer, Doppelt, Milbrath & Gilchrist, P.A.

(57) ABSTRACT

A gate amplification triac including in a semiconductor substrate of a first conductivity type a vertical triac and a lateral bipolar transistor having its emitter connected to the triac gate, its base connected to a control terminal, and its collector connected to a terminal intended to be connected to a first reference voltage, the main terminal of the triac on the side of the transistor being intended to be connected to a second reference voltage, the transistor being formed in a first well of the second conductivity type and the triac comprising on the transistor side a second well of the second conductivity type, the first and second wells being formed so that the substrate-well breakdown voltage of the transistor is greater than the substrate-well breakdown voltage of the triac by at least the difference between the first and second reference voltages.

4 Claims, 3 Drawing Sheets

US 8,912,566 B2

GATE AMPLIFICATION TRIAC

CROSS REFERENCE TO RELATED APPLICATIONS

This application claims the priority benefit of French patent application No. 11/59707, filed on Oct. 26, 2011, which is hereby incorporated by reference to the maximum extent allowable by law.

BACKGROUND

1. Technical Field

Embodiments relate to the field of power components intended to control of A.C. currents, and more specifically to triacs.

2. Discussion of the Related Art

A triac is generally desired to be controlled directly from the output of integrated circuits (controllers or processors). However, such integrated circuits are unable to provide sufficient currents to turn on a triac. Various types of triacs integrating a gate current amplification element have thus been provided. One of the most currently-used solutions is to connect the gate of a main triac via an auxiliary thyristor or triac of small dimension that can be controlled by a low current. Another solution has been to control the gate of a triac via a field-effect device, for example, a MOS transistor.

All these conventional gate current amplification devices have various disadvantages. Especially, the use of field-effect transistors implies the provision of manufacturing steps which are not normally provided in the manufacturing of triacs and other power components. Triacs with an auxiliary thyristor or triac gate amplification often require complex control circuits which should comprise insulation circuits (transformers or optical couplers).

There thus is a need for a gate current amplification triac which is simple to manufacture and which is simple to control.

SUMMARY

An embodiment provides a gate amplification triac comprising in a semiconductor substrate of a first conductivity type a vertical triac and a lateral bipolar transistor having its emitter connected to the triac gate, its base connected to a control terminal, and its collector connected to a terminal intended to be connected to a first reference voltage, the main terminal of the triac on the side of the transistor being intended to be connected to a second reference voltage, the transistor being formed in a first well of the second conductivity type and the triac comprising on the transistor side a second well of the second conductivity type, the first and second wells being formed so that the substrate-well breakdown voltage of the transistor is greater than the substrate-well breakdown voltage of the triac by at least the difference between the first and second reference voltages.

According to an embodiment, the first well is less heavily doped than the second well.

According to an embodiment, the contours of the first well comprise corners of stronger radius of curvature than the corners of the contour of the second well.

According to an embodiment, the triac is laterally insulated by a peripheral insulating wall of the second conductivity type and the first well is formed at the same time as the portion of the insulating wall located on the transistor side.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

It is here provided to manufacture, in the form of a monolithic circuit, a triac with a bipolar-transistor gate amplification.

Figure 1:
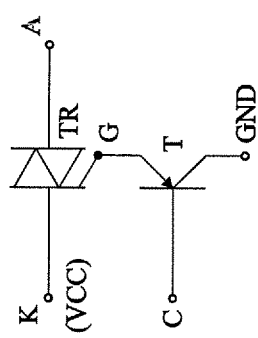
FIG. 1 shows, in the form of a circuit, an embodiment of a gate amplification triac.

As illustrated in FIG. 1, a triac TR has main terminals K and A intended to be connected to a load and to an A.C. power supply source, for example, the electric supply mains. Terminal K is further connected to terminal VCC of a D.C. power supply source having its other terminal connected to a ground GND. Gate G of the triac is connected to the emitter of a PNP transistor T having its collector connected to terminal GND and having its base forming control terminal C of the system. Thus, the power component comprises four terminals A, K, C, and GND and not, as usual, only three terminals A, K, and G. Triac TR is turned on when terminal C is grounded, which turns on PNP transistor T and grounds the triac gate. A control current then flows from terminal K, at voltage VCC, to terminal GND. Thus, the triac can be controlled in quadrants 2 and 3, that is, whatever the biasing of the A.C. voltage between terminals K and A for a negative gate current. Such a circuit enables to control the triac with a low power on terminal C, since this power should only be sufficient to block or turn on transistor T. Thus, terminal C can directly receive the output signals from a control processor.

Figure 2A:
FIGS. 2A and 2B respectively are a cross-section view and a top view of a transistor gate amplification triac.
Figure 2B:
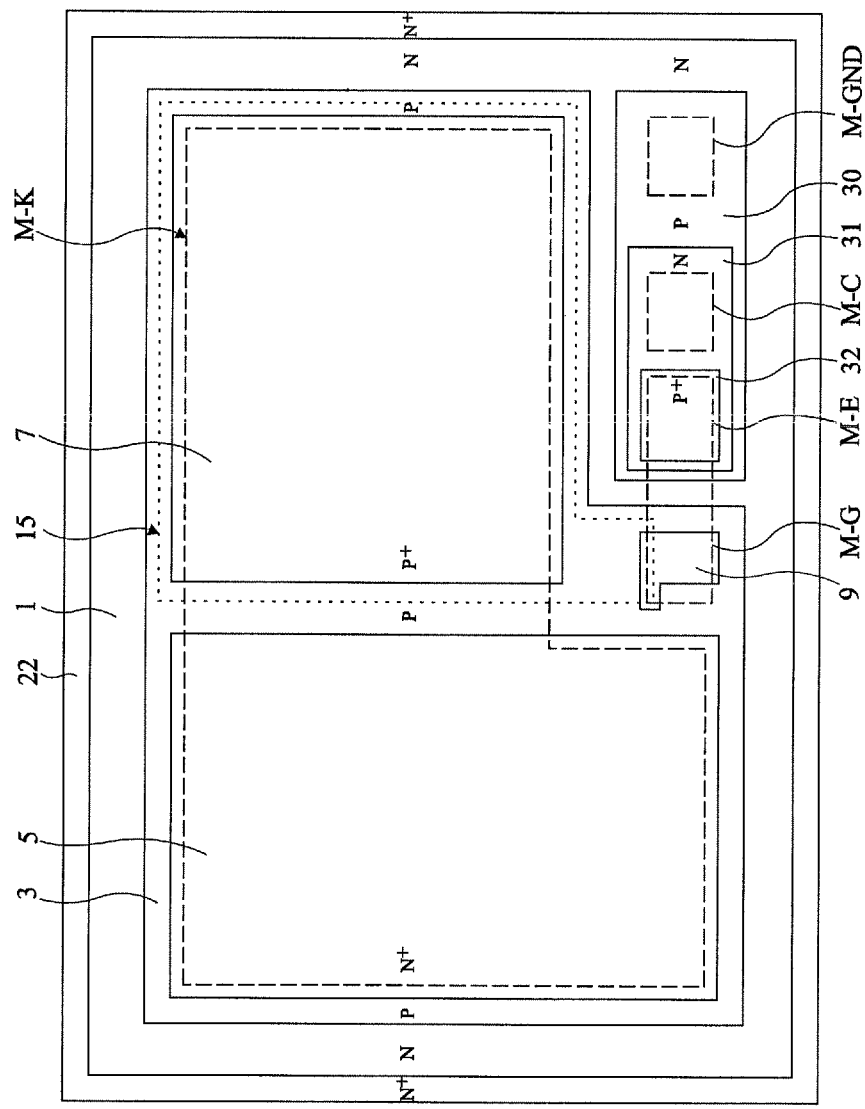

FIGS. 2A and 2B respectively are a cross-section view and a top view of a bipolar transistor gate amplification triac embodying the circuit of FIG. 1 in monolithic form. FIG. 2B is a top view showing a possible real layout of such a gate current amplification triac. However, FIG. 2A does not show a real layout and does not correspond to a cross-section line of the top view of FIG. 2. For readability, to show the various significant elements of the triac and of the transistor, transistor T is shown next to triac TR.

Triac TR is a conventional vertical triac. It is formed in a lightly-doped N-type substrate 1 and comprises, on the upper surface side, a P well 3 in which a heavily-doped N-type region (N$^+$) 5 is formed. The most part of the rest of well 3 is taken up by a more heavily-doped P-type area (P$^+$) 7. Well 3 also contains an N-type region 9 or gate region. On the lower surface side of the substrate is uniformly formed a P-type doped layer 11 which comprises, opposite to N$^+$ region 5, a P$^+$ region 13 and, opposite to P$^+$-type region 7 and to gate region 9, a heavily-doped N-type region 15. The entire lower surface is coated with an anode metallization M-A. N$^+$ layer 5 and P$^+$ layer 7 formed in well 3 are coated with a cathode metallization M-K. Gate region 9 of the triac is coated with a gate metallization M-G which is also in contact with a portion of well 3.

Further, a so-called well structure, in which the entire component is surrounded with a P-type diffused wall 20, generally formed of drive-ins from the lower and upper surfaces of the triac, has been illustrated. A heavily-doped N-type channel stop region 22 has also been illustrated on the upper surface side.

The structure is more realistically shown, although not to scale, in the top view of Fig. 2B where the different areas are designated with the same reference numerals as in FIG. 2A. The representation of FIG. 2B is stopped at the level of channel stop area 22. Conventionally, gate region 9 is located in the vicinity of N$^+$ region 5 and P$^+$ region 7. In FIG. 2B, the metallization contours are designated with long-dash lines. The contour of lower surface N$^+$ region 15 has further been shown in short-dash lines.

A conventional triac TR comprising two head-to-tail thyristors, a NPNPP$^+$ thyristor 5-3-1-11-13 and a P$^+$PNPN thyristor 7, 3, 1, 11, 15, has been described hereabove. Many variations of such a triac will occur to those skilled in the art, the previous description being an example only of triac layout. For example, the periphery may be formed of a mesa-type structure comprising deep trenches filled with an insulator separating P wells 3 and 30 from periphery 20. Further, conventionally, N+ areas 5 and 15 of the upper and lower surfaces are generally provided with openings (emitter short-circuits) especially intended to optimize operating parameters such as the triac sensitivity and its capacity to withstand voltage edges.

The component of FIGS. 2A and 2B, in addition to above-described vertical triac TR, comprises a lateral transistor T. This lateral transistor, of type PNP in the shown example, is formed in a P-type well 30 (collector well) in which a base region 31 and an emitter region 32, respectively of type N and P, are formed. Well 30 is arranged sufficiently close to well 3 so that, when a voltage is applied across the triac, part of the electric field is held in N substrate 1, to limit the electric field to be withstood in the oxide separating the two wells 30 and 3 at the surface and on which is located the metallization connecting the transistor emitter and the triac gate. Collector, base, and emitter metallizations intended to be connected as shown in FIG. 1 are provided. The collector metallization is designated with reference M-GND, the base metallization is designated with reference M-C, with C designating a control terminal, and emitter metallization M-E is connected to gate metallization M-G of the triac, and forms one and the same metallization therewith. The portions of the upper surface which are not in contact with a metallization are coated with an insulating layer, bearing no reference. The cross-section view of FIG. 2A shows, under each of the metallizations, a more-heavily doped area, bearing no reference, intended to ensure the ohmicity of the contacts.

The present inventors have noted that such a structure raises issues in the event of the occurrence of a positive overvoltage or of a positive overvoltage peak on rear surface electrode A with respect to front surface electrode K. As seen previously, front surface electrode K is connected to the A.C. voltage and is biased to voltage VCC. There should thus be a breakdown voltage difference at least equal to VCC between the vertical parasitic thyristor comprising regions 11-1-30-31 and the thyristor corresponding to the triac. Indeed, if the parasitic thyristor turns on, the entire current will flow through the parasitic thyristor and the main thyristor will not start. This may result in a destruction of the component, since the parasitic thyristor is not designed to absorb significant currents.

A first solution provided herein to avoid the starting of the parasitic thyristor comprises doping P-type well 30 of transistor T less than upper surface P-type well 3 of triac TR. More specifically, well 30 may be formed at the same time as the upper surface portion of peripheral insulating wall 20. Thus, the transistor may be formed by using, for most of its components, the same steps as those implemented to form various regions of the triac, which results in decreasing the number of steps necessary for the component manufacturing and thus for a decrease in component costs. Only N-type base region 31 of the bipolar transistor should have a specific doping, lower than that of heavily-doped N-type regions 5, to have a transistor of satisfactory gain.

Figure 3:
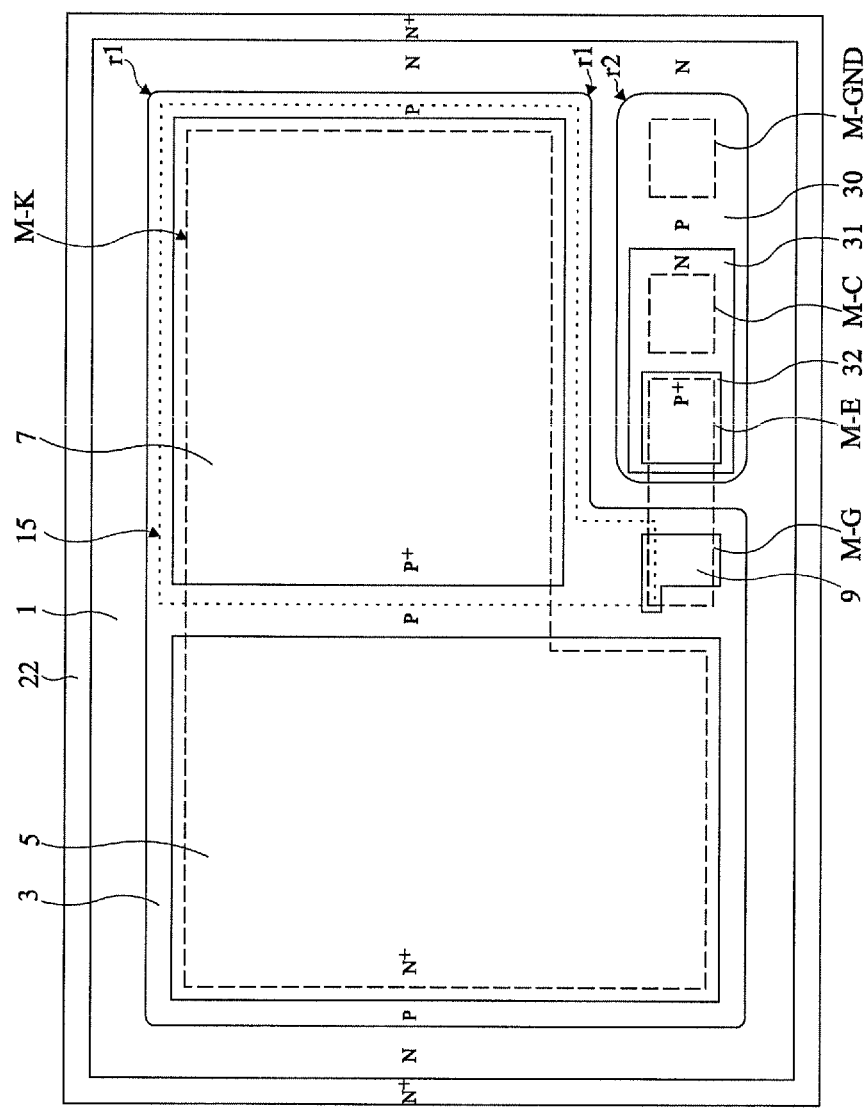
FIG. 3 illustrates a variation of the top view of FIG. 2B.

A second solution provided herein to avoid the starting of the parasitic transistor is illustrated in the top view of FIG. 3. FIG. 3 is identical to FIG. 2B except as concerns the corners of wells 3 and 30. Generally, the well corners really obtained after the various anneals implied in the component manufacturing are not square as schematically shown in FIG. 2B, but somewhat rounded. It is here provided to provide for the corners of triac well 3 to have a radius of curvature r1 much smaller than radius of curvature r2 of the corners of well 30 of the transistor. This sole modification enables to obtain for the transistor breakdown voltage to be smaller than that of the triac at least by the value of VCC.

The two solutions provided hereabove may advantageously be combined. A layout of gate region 9 especially capable of optimizing the compromise between the triac sensitivity and its immunity to parasitic dV/dt starlings will also be provided. It will also be ascertained to provide a proper distribution of the emitter short-circuit holes in regions 3 and 15.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A gate amplification triac comprising, in a semiconductor substrate of a first conductivity type, a vertical triac and a lateral bipolar transistor having its emitter connected to the triac gate, its base connected to a control terminal, and its collector connected to a terminal intended to be connected to a first reference voltage, the main terminal of the triac on the side of the transistor being intended to be connected to a second reference voltage, the transistor being formed in a first well of the second conductivity type and the triac comprising on the transistor side a second well of the second conductivity type, the first and second wells being formed so that the substrate-well breakdown voltage of the transistor is greater than the substrate-well breakdown voltage of the triac by at least the difference between the first and second reference voltages.

2. The gate amplification triac of claim 1, wherein the first well is less heavily doped than the second well.

3. The gate amplification triac of claim 2, wherein the contours of the first well comprise corners of stronger radius of curvature than the corners of the contour of the second well.

4. The gate amplification triac of claim 1, wherein the triac is laterally insulated by a peripheral insulating wall of the second conductivity type and wherein the first well (30) is formed at the same time as the portion of the insulating wall located on the transistor side.

* * * * *